(12) United States Patent
Morita

(10) Patent No.: US 7,245,175 B2
(45) Date of Patent: Jul. 17, 2007

(54) SEMICONDUCTOR SWITCH

(75) Inventor: Koichi Morita, Niiza (JP)

(73) Assignee: Sanken Electric Co. Ltd. (JP)

( * ) Notice: Subject to any disclaimer, the term of this patent is extended or adjusted under 35 U.S.C. 154(b) by 177 days.

(21) Appl. No.: 10/522,264

(22) PCT Filed: May 28, 2004

(86) PCT No.: PCT/JP2004/007756

§ 371 (c)(1),
(2), (4) Date: Jan. 25, 2005

(87) PCT Pub. No.: WO2005/002054

PCT Pub. Date: Jan. 6, 2005

(65) Prior Publication Data

US 2005/0225373 A1    Oct. 13, 2005

(30) Foreign Application Priority Data

Jun. 30, 2003 (JP) .............................. 2003-187106

(51) Int. Cl.
*H03K 17/687* (2006.01)

(52) U.S. Cl. ...................................... 327/427; 327/436

(58) Field of Classification Search ................ 327/427, 327/437, 391, 442, 308, 374, 377, 336, 389
See application file for complete search history.

(56) References Cited

U.S. PATENT DOCUMENTS

| 3,521,087 A | 7/1970 | Lombardi |
| 5,748,025 A * | 5/1998 | Ng et al. ...................... 327/333 |
| 6,580,306 B2 * | 6/2003 | Hardee ........................ 327/328 |

FOREIGN PATENT DOCUMENTS

| JP | 130693/1983 | 3/1985 |
| JP | 05-075110 A | 3/1993 |
| JP | 08-321759 | 3/1996 |
| JP | 10-261945 | 9/1998 |

* cited by examiner

*Primary Examiner*—Dinh T. Le
(74) *Attorney, Agent, or Firm*—Kilpatrick Stockton LLP

(57) ABSTRACT

A semiconductor switch includes first and second normally off type FETs Q1, Q2 and a normally on type FET Q3 connected between the first normally off type FET Q1 and the second normally off type FET Q2. Further, in the semiconductor switch, the normally on type FET Q3 is connected between the first and second normally off type FETs Q1, Q2 in series.

26 Claims, 8 Drawing Sheets

Prior Art

SEMICONDUCTOR SWITCH

TECHNICAL FIELD

The present invention relates to semiconductor switches and, more particularly, to a high-voltage semiconductor switch, available for use in an alternating current, including a normally on type FET, with a high withstand voltage, which is formed of a compound semiconductor and Si and two normally off type MOS FETs, with low on-resistance, which are connected to the normally on type FET in series.

BACKGROUND ART

FIGS. 1, 2, and 3 show that alternating current semiconductor switches (hereinafter referred to as alternating current switches) that controllably switch on and switch off an alternating current signal by control signals. These alternating current switches employ two high-voltage FETs to controllably switch on and switch off the alternating current signal applied to first and second terminals 11 and 12.

An alternating current switch shown in FIG. 1 is comprised of a normally off type MOS FET Q11 (hereinafter referred to as FET Q11) and a normally off type MOS FET Q12 (hereinafter referred to as FET Q12), which are connected in series in opposite direction between the first and second terminals 11 and 12. With an alternating current switch shown in FIG. 2, a normally off type FET Q13 and a normally off type FET Q14 are connected in series in opposite direction and the connection between a drain and a source is opposite to that shown in FIG. 1.

With the alternating current switch shown in FIG. 1, if a first gate signal lies at a positive voltage and is applied from the gate terminal G1t to a gate G1 of the FET Q11 while a second gate signal lies at a positive voltage and is applied from the gate terminal G2t to a gate G2 of the FET Q12, both the FET Q11 and the FET Q12 are turned on. Therefore, during a period wherein the first and second gate signals lie at the positive voltage, a current flows from the first terminal 11 to the second terminal 12 when the first terminal 11 is applied with the positive voltage whereas a current flows from the second terminal 12 to the first terminal 11 when the second terminal 12 is applied with the positive voltage.

Next, if the first and second gate signals lie at zero voltage and are applied to the gates of the FET Q11 and the FET Q12, both the FET Q11 and the FET Q12 are turned off. For this reason, no current flows through the alternating current switch.

Also, the alternating current switch shown in FIG. 2 operates in the same manner as that shown in FIG. 1.

An alternating current switch shown in FIG. 3 is comprised of a first series circuit, composed of a diode D11 and a normally off type FET Q15, and a second series circuit, composed of a diode D12 and a normally off type FET Q16, which are connected in parallel between the first and second terminals 11, 12. An anode of the diode D11 is connected to the first terminal 11 and an anode of the diode 12 is connected to the second terminal 12.

With the alternating current switch shown in FIG. 3, if a first gate signal takes a positive voltage and is applied from a gate terminal G1t to a gate G1 of the FET Q15 while a second gate signal takes a positive voltage and is applied from a gate terminal G2t to a gate G2 of the FET Q16, both the FETs Q15 and Q16 are turned on. For this reason, a current flows in a path expressed as "First Terminal 11→Diode D11→FET Q15→Second Terminal 12". That is, during a period in which the first and second gate signals take a positive voltage, a current flows from the first terminal 11 to the second terminal 12 when the second terminal 12 is applied with a positive voltage. Also, when the second terminal 12 is applied with a positive voltage, a current flows in a path expressed as "Second Terminal 12→Diode D12→FET Q16→First Terminal 11". That is, the current flows from the second terminal 12 to the first terminal 11.

Next, if the first and second gate signals take zero voltage and are applied to the gates of the FETs Q15, Q16, both the FETs Q15 and Q16 are turned off. Therefore, no current flows through the alternating current switch.

However, with the alternating current switches shown in FIGS. 1 and 2, since the high-voltage elements with high on-resistance are connected in series, on-resistance of the alternating current semiconductor switch remarkably increases, resulting in an increase in losses. Further, with the alternating current switch shown in FIG. 3, the number of component parts increases with a resultant increase in costs.

In the meanwhile, although the FET of the semiconductor, made of compound such as SiC and GaN or the like, has a high withstand voltage but low on-resistance, and is highly suited to a heavy-power switch, only a so-called normally on type FET (an FET through which drain current flows when a gate signal falls at a zero potential) can be manufactured. With such a normally on type FET, no gate signal exists during a time interval in which a power supply is turned on and, hence, a drain current is caused to flow with resultant damages to the normally on type FET, resulting in an extremely difficult usage. For this reason, there has been a need for development of an FET in which no current flows even in the presence of a gate signal at a zero potential.

Therefore, as shown in FIG. 4, proposal has been made in the past to use a direct current switch wherein a normally on type FET Q18, composed of SiC with a high voltage, and a normally off type FET Q17 with a low voltage and low on-resistance are connected in cascade between the first and second terminals 11 and 12 as disclosed in Japanese Patent Application Laid-Open NO. 5-75110. This direct current switch is configured to be of a high voltage with low on-resistance and a direct current signal is applied across the first and second terminals 11 and 12.

With the direct current switch shown in FIG. 4, if a gate G1 of the FET Q17 is applied with a voltage greater than a threshold value, the FET Q17 is turned on and the FTE Q18 is also turned on. Further, if the gate G1 of the FET Q17 is applied with a voltage less than the threshold value, the FET Q17 is turned off and the FTE Q18 is also turned off. That is, the direct current switch is turned on or turned off when the voltage is applied to the gate G1 of the FET Q17 and the FET Q17 can serve to operate as if it were a single FET with a high withstand voltage.

However, the direct current switch, shown in FIG. 4, cannot be used for alternating current switch. For this reason, the alternating current switch has been realized using the circuits shown in FIGS. 5 and 6.

The alternating current switch, shown in FIG. 5, has a circuit structure in which the direct current switch, shown in FIG. 4, is applied to the alternating current switch shown in FIG. 3. The FETs Q19, Q21, shown in FIG. 5, correspond to the FET Q15 shown in FIG. 3, and the FETs Q20, Q22, shown in FIG. 5, correspond to the FET Q16 shown in FIG. 3, operating in the same manner as those shown in FIGS. 3 and 4, respectively.

The alternating current switch, shown in FIG. 6, has a circuit structure in which the direct current switch, shown in FIG. 4, is applied to the alternating current switch shown in FIG. 1. The FETs Q25, Q26, shown in FIG. 6, corresponds to the FET Q11, shown in FIG. 1, and the FETs Q23, Q24, shown in FIG. 6, corresponds to the FET Q12 shown in FIG. 3, operating in the same manner as those shown in FIGS. 3 and 4, respectively.

DISCLOSURE OF INVENTION

However, with the alternating current switch shown in FIG. 5, there is a need for two pieces of normally on type FETs as compared to the alternating current switch shown in FIG. 3 and, further, there is a need for extra two pieces of power diodes for permitting main current to flow. That is, this results in an increase in the number of component parts with a resultant increase in costs and an increase in losses caused by the diodes. Also, the alternating current switch shown in FIG. 6 uses an increased number of component parts with an increase in costs.

It is therefore an object of the present invention to provide a semiconductor switch wherein controllably turning on and turning off an alternating current switch enables reduction in losses and which has a high withstand voltage and low in costs.

The present invention has been completed with a view to addressing the above issues and one aspect of the present invention provides a semiconductor switch comprising a normally on type FET and first and second normally off type FETs which are connected in series, wherein the normally on type FET is connected between the first normally off type FET and the second normally off type FET.

Another aspect of the present invention provides a semiconductor switch comprising a plurality of series connected normally on type FETs and first and second series connected normally off type FETs, wherein the plurality of normally on type FETs are connected between the first normally off type FET and the second normally off type FET.

BEST MODE FOR CARRYING OUT THE INVENTION

Hereinafter, semiconductor switches of various embodiments according to the present invention are described in detail with reference to the accompanying drawings.

First Embodiment

A semiconductor switch of a first embodiment according to the present invention is comprised of two MOS FETs, made of Si, with a low-voltage and low-on resistance between which a high voltage compound semiconductor FET is connected in series to controllably switch on or switch off an alternating current signal with a resultant decrease in losses to provide a semiconductor switch that has a high withstand-voltage and is cost effective.

Figure 1:
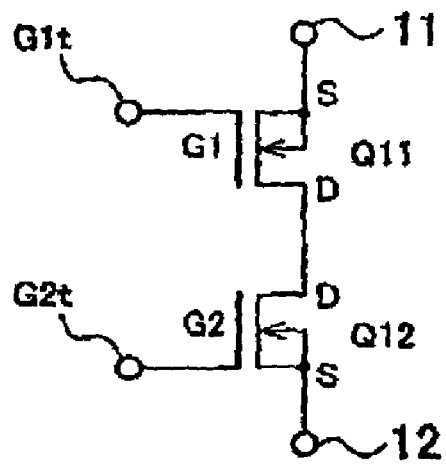
FIG. 1 is a circuit diagram illustrating an example 1 of a semiconductor switch of the related art.
Figure 2:
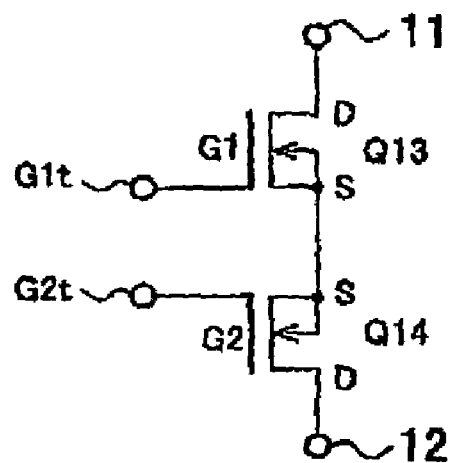
FIG. 2 is a circuit diagram illustrating an example 2 of a semiconductor switch of the related art.
Figure 3:
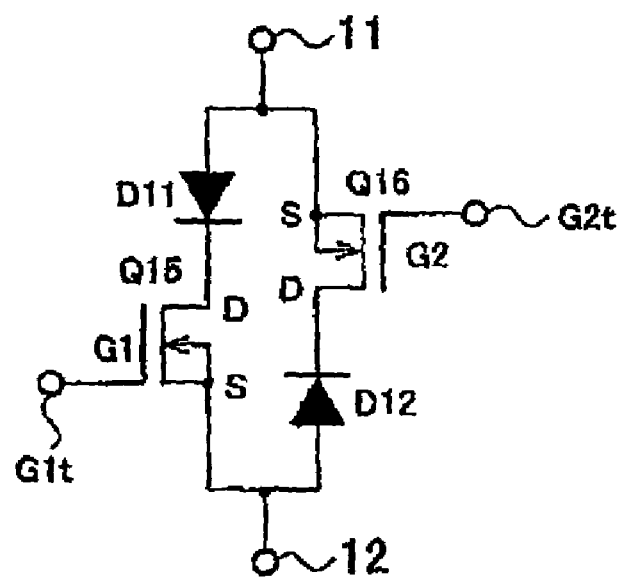
FIG. 3 is a circuit diagram illustrating an example 3 of a semiconductor switch of the related art.
Figure 4:
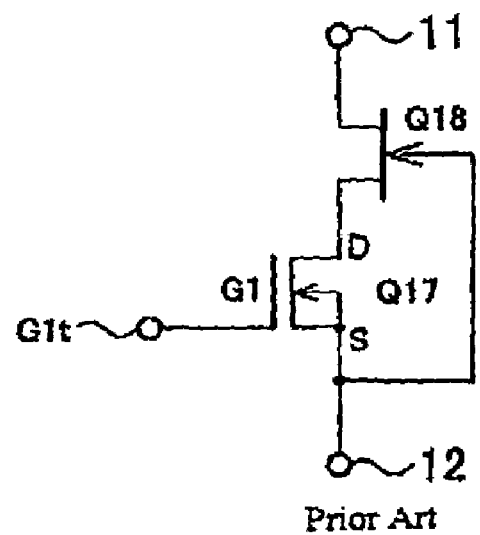
FIG. 4 is a circuit diagram illustrating an example 4 of a semiconductor switch of the related art.
Figure 5:
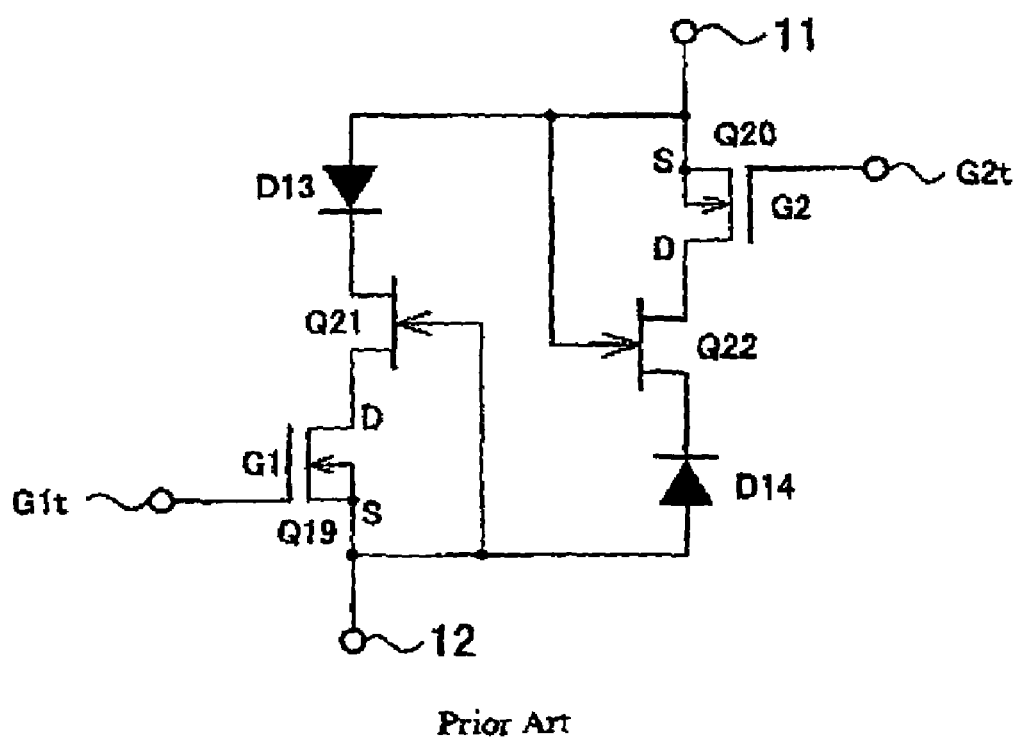
FIG. 5 is a circuit diagram illustrating an example 5 of a semiconductor switch of the related art.
Figure 6:
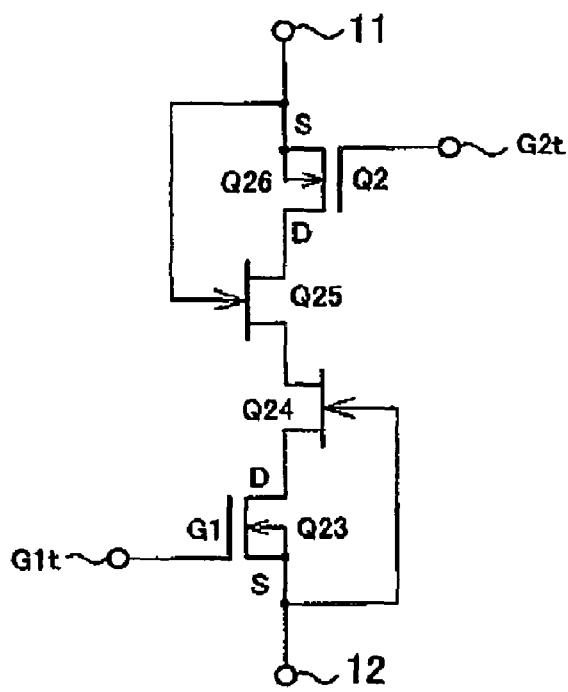
FIG. 6 is a circuit diagram illustrating an example 6 of a semiconductor switch of the related art.
Figure 7:
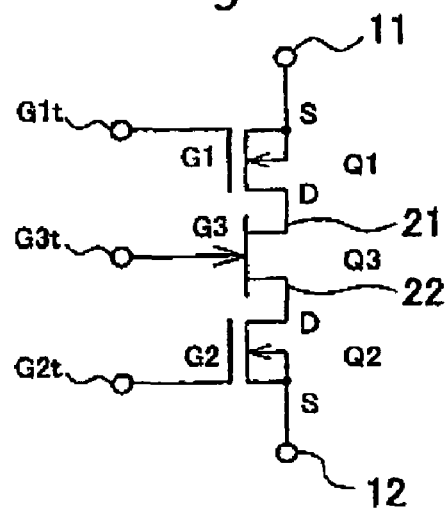
FIG. 7 is a fundamental circuit diagram of a semiconductor switch of a first embodiment according to the present invention.

FIG. 7 is a fundamental circuit diagram of the semiconductor switch of the first embodiment according to the present invention.

The semiconductor switch, shown in FIG. 7, is comprised of normally off type FETs Q1 and Q2 and a normally on type FET Q3 that is connected between the normally off type FETs Q1 and Q2. A source of the FET Q1 is connected to a first terminal 11 and a drain of the FET Q1 is connected to a first main electrode 21 of the FET Q3, whose second main electrode 22 is connected to a drain D of the FET Q2 whose source S is connected to a second terminal 12.

The FETs Q1, Q2 include MOS FETs with a low voltage and low on-resistance, respectively. The FET Q3 has low on-resistance and a high withstand-voltage and includes, for instance, a compound semiconductor, such as SiC or GaN or the like, or a MESFET. The source and drain of the normally-on type FET Q3 are symmetrically formed in structure and, hence, the first main electrode 21 or the second main electrode 22 connected to a high potential terminal, of the first terminal 11 and the second terminal 12, plays a role as a drain whereas the other main electrode, connected to a lower potential terminal, serves as a source.

Further, a first gate signal, composed of a pulse signal or the like, is applied to a gate G1 of the FET Q1 via a gate terminal G1t and a second gate signal is applied to a gate G2 of the FET Q2 via a gate terminal G2t whereas a third gate signal is applied to a gate G3 (control electrode) of the FET Q3 via a gate terminal G3t.

Now, the operation of the semiconductor switch of the first embodiment with such a structure is described below.

First, with an alternating current signal being applied across the first and second terminals 11, 12, if the first terminal 11 lies at a high potential and the second terminal 12 lies at a low potential, the first main electrode 21 of the FET Q3 becomes the drain and the second main electrode 22 becomes the source. If a third gate signal, which allows the gate G3 to lie at a high potential or zero potential with respect to the potential of the second main electrode 22 serving as the source, is applied to the gate terminal G3t, the FET Q3 is turned on. Also, in this moment, if the first gate signal is applied through the gate terminal G1t to the gate G1 of the FET Q1 at a positive voltage whereas the second gate signal is applied through the gate terminal G2t to the gate G2 of the FET Q2 at a positive voltage, then, both the FETs Q1, Q2 are turned on.

Next, if the second terminal 12 lies at a high potential and the first terminal 12 lies at a low potential, the first main electrode 21 of the FET Q3 becomes the source and the second main electrode 22 becomes the drain. If the third gate signal, which allows the gate G3 to remain at the high potential or zero potential with respect to the potential of the first main electrode 21 serving as the source, is applied to the gate terminal G3t, the FET Q3 is turned on.

Also, in this moment, if the first gate signal is applied through the gate terminal G1t to the gate G1 of the FET Q1 at a positive voltage whereas the second gate signal is applied through the gate terminal G2t to the gate G2 of the FET Q2 at a positive voltage, then, both the FETs Q1, Q2 are turned on.

Additionally, even if the first terminal 11 lies at a high potential and the second terminal 11 lies at a low potential while the second terminal 12 lies at a high potential and the first terminal 12 lies at a low potential, the FET Q3 is turned off upon receipt of the gate signal that allows the gate G3 to lie at the low potential with respect to the potential of the main electrode that serves as the source.

Thus, with the semiconductor switch of the first embodiment, the presence of the FET, composed of the high-voltage compound semiconductor connected, to the two low-voltage and low on-resistance MOS FETs, each made of Si, in series to controllably switch on or switch off the alternating current signal enables reduction in losses, making it possible to provide a semiconductor switch, with a high withstand voltage, which is low in costs.

(Concrete Circuitry for Semiconductor Switch)

Figure 8:
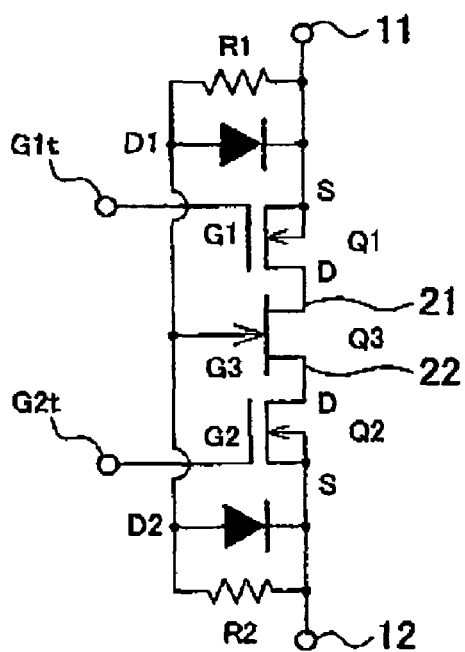
FIG. 8 is a detailed circuit diagram of the semiconductor switch of the first embodiment according to the present invention.

FIG. 8 is a concrete circuit diagram of the semiconductor switch of the first embodiment according to the present invention. While the semiconductor witch, shown in FIG. 7, allows the gate G3 of the FET Q3 to be applied with the voltage of the third gate signal applied from the gate terminal G3t, the semiconductor witch, shown in FIG. 8, contemplates to allow a voltage of an alternating current signal, applied to the first and second terminals 11, 12, to be applied to the gate G3 of the FET Q3 through resistors for thereby eliminating the need for inputting the third gate signal.

Connected to the source S of the FET Q1 are a cathode of a diode D1 and one terminal of a resistor R1 that serves as second current supply means. Connected to the source S of the FET Q2 are a cathode of a diode D2 and one terminal of a resistor R2 serving as second current supply means. An anode of the diode D1 and the other terminal of the resistor R1 and an anode of the diode D2 and the other terminal of the resistor R2 are connected to the gate G3 of the FET Q3. The diode D1, D2 serve as diodes to select one of the sources of the FETs Q1, Q2 in which the source has a lower potential than that of the other. The resistors R1, R2 serve to admit biasing currents to flow to the associated diodes, respectively.

Also, since the semiconductor switch has the same other structure as that shown in FIG. 7, the same component parts bear like reference numerals and detail description of the same is herein omitted.

Figure 9:
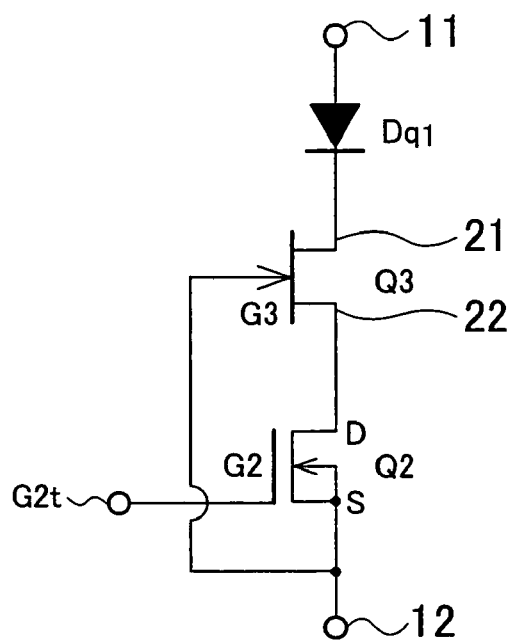
FIG. 9 is a first equivalent circuit diagram of the semiconductor switch shown in FIG. 8.
Figure 10:
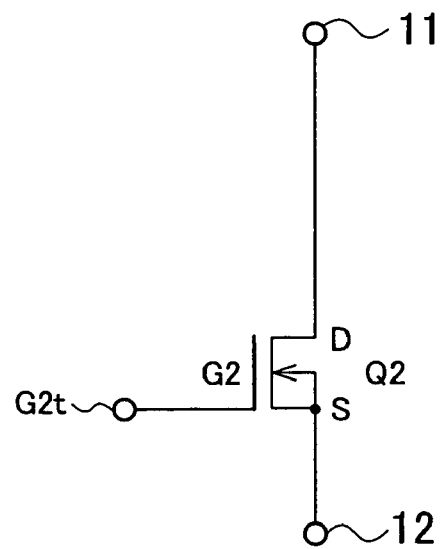
FIG. 10 is a second equivalent circuit diagram of the semiconductor switch shown in FIG. 8.

Now, the operation of the semiconductor switch shown in FIG. 8 is described. First, if the first terminal 11 lies at a high potential and the second terminal 12 lies at a low potential, this results in a first equivalent circuit shown in FIG. 9. When this takes place, applying a gate signal to the gate G2 of the FET Q2 enables the same to be turned on. That is, one of the diodes D1 and D2, whose potential is low, is selected and the diode D2 is turned on whereupon the gate G3 of the FET Q3 takes a potential of the source S of the FET Q2. For this reason, when the FET Q2 is turned on, the FET Q3 is turned on. With the FET Q2 turned off, no drain current flows and no drain current though the FET Q3 that is consequently turned off. That is, this results in an equivalent circuit shown in FIG. 10. In this moment, if the FET Q2 is applied with the gate signal, the MOS FET is able to minimize a forward drop of a body diode Dq1.

Figure 11:
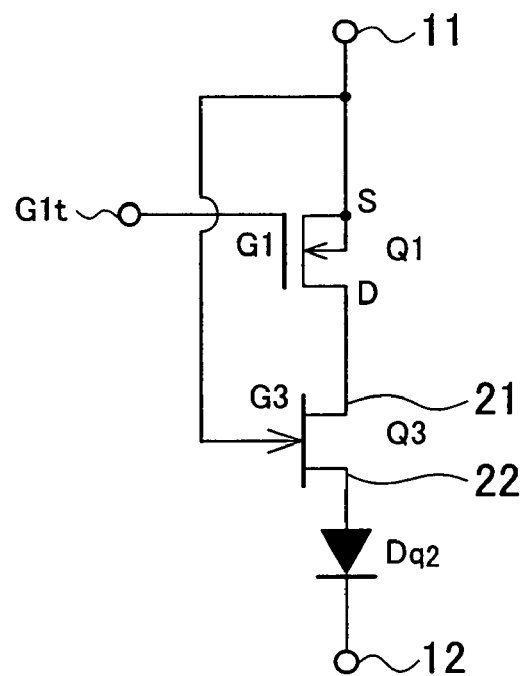
FIG. 11 is a third equivalent circuit diagram of the semiconductor switch shown in FIG. 8.
Figure 12:
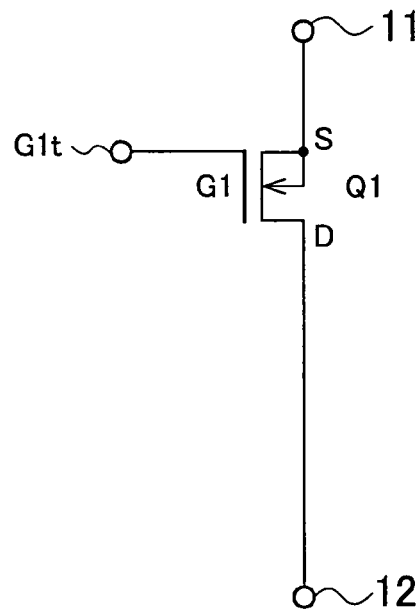
FIG. 12 is a fourth equivalent circuit diagram of the semiconductor switch shown in FIG. 8.

Further, in FIG. 8, if the first terminal 11 lies at a low potential and the second terminal 12 lies at a high potential, this results in an equivalent shown in FIG. 11. Applying a first gate signal to the gate G1 of the FET Q1 enables the same to be turned on and turned off. That is, selecting the potential laying at a low value by the use of the diodes D1 and D2 enables the diode D1 to be turned on and the gate G3 of the FET Q3 takes the potential of the source S of the FET Q2. For this reason, when the FET Q1 is turned on, the FET Q3 is turned on. With the FET Q1 turned off, no drain current flows through the FET Q1 and no drain current flows through the FET Q3 that is consequently turned off. That is, this results in an equivalent circuit shown in FIG. 12. In this moment, if the FET Q2 is applied with the gate signal, the MOS FET is able to minimize a forward drop of a body diode Dq2. That is, using the first and second terminals 11, 12 enables the alternating current signal to be switched on and switched off.

Second Embodiment

Figure 13:
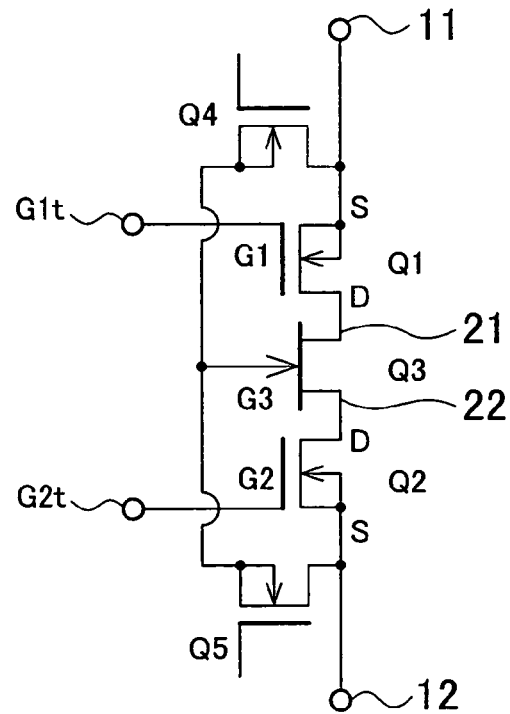
FIG. 13 is a circuit diagram of a semiconductor switch of a second embodiment according to the present invention.

FIG. 13 is a circuit diagram of a semiconductor switch of a second embodiment according to the present invention. The semiconductor switch of the second embodiment features that in place of the diodes D1, D2 of the semiconductor switch of the first embodiment, FETs Q4, Q5 are provided to prevent erroneous operation due to noises and leakage current.

In FIG. 13, the FETs Q4, Q5 include normally off type MOS FET switches, respectively, and a drain D of the FET Q4 is connected to the first terminal 11 while a drain D of the FET Q5 is connected to the second terminal 12. Sources S, S of the FETs Q4, Q5 are connected to a gate G3 of a FET Q3.

Further, of the FETs Q4, Q5, applying a gate signal with a positive voltage to the gate of the FET, which is connected to the terminal at a low potential, allows the same to be turned on and applying a gate signal with a negative voltage to the gate of the FET, which is connected to the terminal at a high potential, allows the same to be turned off. Here, of the FETs Q4, Q5, the FET, which is connected to one of the FETs Q1, Q2 whose source lies at a low potential, is turned on, while the FET, which is connected to one of the FETs Q1, Q2 whose source lies at a low potential, is turned off.

Next, the operation of the semiconductor switch of the second embodiment with such a structure is described.

First, if the first terminal 11 lies at a high potential and the second terminal 12 lies at a low potential, applying a second gate signal to the gate G2 of the FET Q2 enables the same to be turned on and turned off. That is, applying a gate signal with a positive voltage to the gate of the FET Q5 enables the FET Q2 to be turned on. For this reason, the gate G3 of the FET Q3 takes a potential of the source S of the FET Q2. Therefore, if the FET Q2 is turned on, then, the FET Q3 is turned on. With the FET Q2 turned off, no drain current flows and no drain current flows through the FET Q3 that is consequently turned off.

Further, if the first terminal 11 lies at a low potential and the second terminal 12 lies at a high potential, applying a first gate signal to the gate G1 of the FET Q1 enables the same to be turned on and off. That is, applying a gate signal with a positive voltage to the gate of the FET Q4 enables the FET Q1 to be turned on. Thus, the gate G3 of the FET Q3 takes a potential of the source S of the FET Q1. For this reason, if the FET Q1 is turned on, then, the FET Q3 is turned on. Therefore, if the FET Q1 is turned off, the FET Q3 is turned off. If the FET Q1 is turned off, no drain current flows and no drain current flows through the FET Q3 that is consequently turned off. That is, using the first and second terminals 11, 12 enables the alternating current signal to be switched on and switched off.

Thus, the semiconductor switch of the second embodiment has the same advantageous effects as those of the semiconductor switch of the first embodiment and a capability of stably turning on the FETs Q4, Q5, thereby enabling the prevention of erroneous operations due to noises and leakage current.

Third Embodiment

Figure 14:
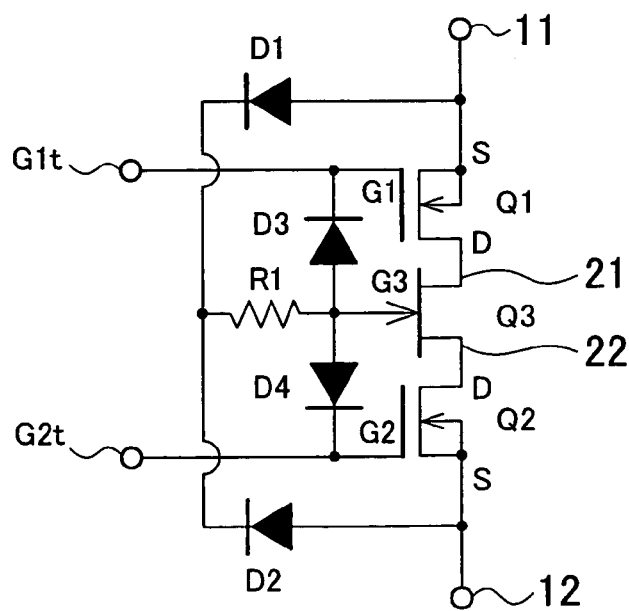
FIG. 14 is a circuit diagram of a semiconductor switch of a third embodiment according to the present invention.

FIG. 14 is a circuit diagram of a semiconductor switch of a third embodiment according to the present invention. A normally on type FET is probable to encounter a phenomenon wherein the FET is not completely turned off at the gate voltage of zero voltage to cause current to flow in a halfway. The semiconductor switch of the third embodiment has a feature in that current is caused to flow from a terminal at a high potential to the gate G3 of the FET Q3 via a diode and resistor to allow the gate voltage to have a positive voltage to reliably turn on the FET Q3.

Also, in FIG. 14, the same component parts as those shown in FIG. 7 bear like reference numerals to omit description of the same.

Connected to a first terminal 11 is an anode of a diode D1, whose cathode is connected via a resistor R1 to an anode of a diode D3, an anode of a diode D4 and a gate G3 of an FET Q3. A cathode of the diode D3 is connected to a gate G1 of an FET Q1 and a cathode of the diode D4 is connected to a gate G2 of an FET Q2. Connected to a second terminal 12 is an anode of a diode D2, whose cathode is connected to one terminal of the resistor R1 and the cathode of the diode D1.

Next, the operation of the semiconductor switch of the third embodiment with such a structure is described. Here, description is made of only the operation related to the FET Q3 whose gate G3 is applied with signals from the diodes D1 to D4.

First, if the first terminal 11 lies at a high potential and the second terminal 12 lies at a low potential, the first main electrode 21 of the FET Q3 serves as a drain and the second main electrode 22 serves as a source. When this takes place, current flows in a path expressed as "First Terminal 11→Diode D1→Resistor R1→Gate G3 of FET Q3". This enables the FET Q3 to enhance the gate voltage, thereby reliably turning on the FET Q3. Also, the diode D2 remains off.

Next, if the second terminal 12 lies at a high potential and the first terminal 11 lies at a low potential, the first main electrode 21 of the FET Q3 serves as a source and the second main electrode 22 serves as a drain. When this takes place, current flows in a path expressed as "Second Terminal 12→Diode D2→Resistor R1→Gate G3 of FET Q3". This enables the FET Q3 to enhance the gate voltage, thereby reliably turning on the FET Q3. Also, the diode D1 remains off.

Thus, the semiconductor switch of the third embodiment has the same advantageous effects as those of the semiconductor switch of the first embodiment and, in addition, is able to allow current to flow from the terminal at the high potential to the gate G3 of the FET Q3 via the diode and resistor to cause the gate voltage to be positive voltage for thereby reliably turning on the FET Q3.

Fourth Embodiment

Figure 15:
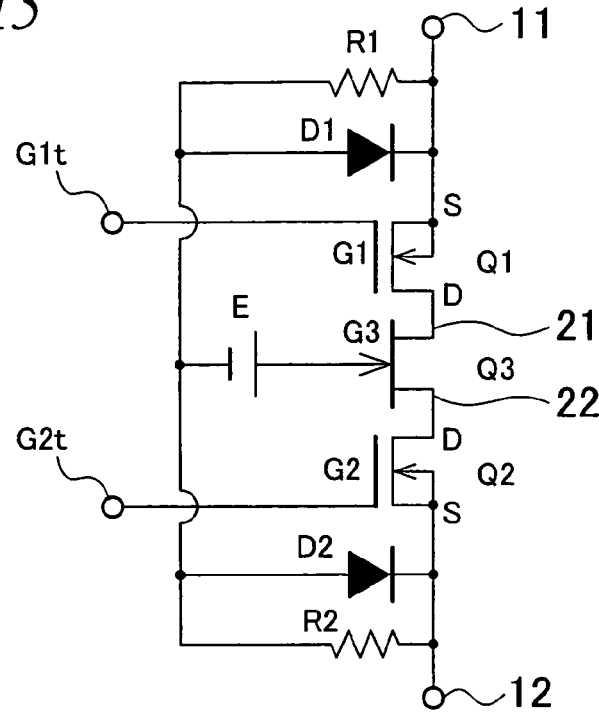
FIG. 15 is a circuit diagram of a semiconductor switch of a fourth embodiment according to the present invention.

FIG. 15 is a circuit diagram of a semiconductor switch of a fourth embodiment according to the present invention. The semiconductor switch of the fourth embodiment has a feature to further include, in addition to the structure shown in FIG. 8, a direct current power supply E that is connected between a junction between resistors R1, R2 and the gate G3 of the FET Q3. The direct current power supply E has a positive terminal connected to the gate G3 of the FET Q3 and a negative electrode connected to the junction between the resistors R1, R2.

Also, in FIG. 15, the same component parts as those shown in FIG. 7 bear like reference numerals to omit description of the same.

Thus, with the semiconductor switch of the fourth embodiment, since a direct-voltage of the direct current power supply E is applied to the gate G3 of the FET Q3 as a bias voltage at all times, no shortage in gate voltage occurs and no erroneous operation of the FET Q3 is avoided.

Fifth Embodiment

With the semiconductor switch shown in FIG. 8, each of the FETs Q2, Q3 is an FET, made of Si, with a withstand voltage of 20V and on-resistance of 1 mΩ. The FET Q3 is a normally on type compound FET with a withstand voltage of 1000V. If the FET Q3 is supposed to be turned off at the gate voltage of −20V, the FET Q2 has a withstand voltage of 20V and the presence of the withstand voltage 20V enables the operation.

However, if the FET Q3 includes an FET, made of a compound semiconductor with a further increased withstand voltage of, for instance, 4000V, to turn off this FET, the gate should be applied with a voltage of approximately −50V. For this reason, in order to turn on and turn ff the semiconductor switch shown in FIG. 8, the FETs Q1, Q2 need to have a withstand voltage of 50V.

But, with the Si-FET with a withstand voltage of 50V, on-resistance becomes 5 to 10 times greater than that of the FET with a withstand voltage of 20V, resulting in an increase in entire on-resistance.

Figure 16:
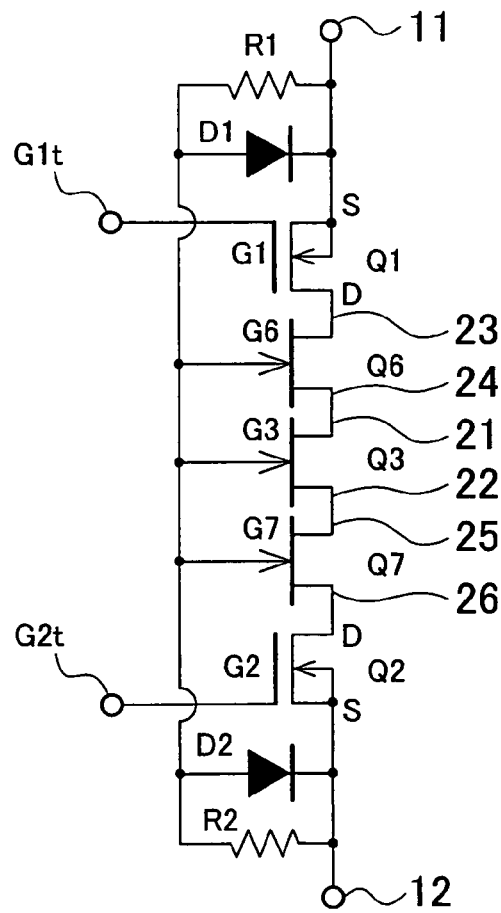
FIG. 16 is a circuit diagram of a semiconductor switch of a fifth embodiment according to the present invention.

Therefore, as shown in FIG. 16, the semiconductor switch of the fifth embodiment contemplates to further include, in addition to the structure of the semiconductor switch shown in FIG. 8, a normally on type FET Q6 with a medium voltage connected between the FETs Q1, Q3 and a normally on type FET Q7 with a medium voltage connected between the FETs Q3, Q2.

With a set of the FETs Q2 and Q7 and a set of the FETs Q1 and Q6 arranged in a structure, as shown in FIG. 16, to form an equivalent circuit equal to the FET with a withstand voltage greater than 50V, the FET Q3 can be turned on and turned off. That is, the FETs Q6 and Q7 include normally on type FETs, respectively, which can be turned on and turned off at a gate signal less than −20V and, hence, the FETs Q1 and Q2 are sufficed to have a withstand voltage of 20V. Also, the FET Q3 includes normally on type FET that can be turned on and turned off at the gate signal of a value less than −50V and, hence, the FETs Q6 and Q7 are sufficed to have a withstand voltage of 50V.

Hereunder, details of a structure and operation of the semiconductor switch shown in FIG. 16 is described below. A first main electrode 23 of the FET Q6 is connected to a drain D of the FET Q1 and a second electrode 24 of the FET Q6 is connected to a first main electrode 21 of the FET Q3. A first main electrode 25 of the FET Q7 is connected to a second main electrode 22 of the FET Q3 and a second electrode 26 of the FET Q7 is connected to a drain D of the FET Q2. Connected to the gate G3 of the FET Q3 in common are a gate 6 of the FET Q6 and a gate G7 of the FET Q7.

Next, the operation of the semiconductor switch of the fifth embodiment with such a structure is described below.

First, if the first terminal 11 lies at a high potential and the second terminal 12 lies at a low potential, applying a second gate signal to the gate G2 of the FET Q2 enables the same to be turned on and turned off. That is, the diode D2 is turned on and the gate G3 of the FET Q3, the gate G6 of the FET Q6 and the gate 7 of the FTE Q7 lie at a potential of the source S of the FET Q2. For this reason, with the FET Q2 turned on, the FETs Q3, Q6, Q7 are turned on. With the FET Q2 turned off, no drain current flows and no drain current flows through the FETs Q3, Q6, Q7, which are consequently turned off.

Further, if the first terminal 11 lies at a low potential and the second terminal 12 lies at a high potential, applying a first gate signal to the gate G1 of the FET Q1 enables the same to be turned on and turned off. That is, the diode D1 is turned on and the gate G3 of the FET Q3, the gate G6 of the FET Q6 and the gate 7 of the FTE Q7 lie at a potential of the source S of the FET Q1. For this reason, with the FET Q1 turned on, the FETs Q3, Q6, Q7 are turned on. With the FET Q1 turned off, no drain current flows and no drain current flows through the FETs Q3, Q6, Q7, which are consequently turned off. That is, using the first and second terminals 11, 12 enable the alternating current signal to be switched on or switched off.

Thus, the semiconductor switch of the fifth embodiment has the same advantageous effects as those of the semiconductor switch of the second embodiment and is able to provide a semiconductor switch with a high voltage that is comprised of three normally on type FETs and two normally off type SI-MOS FETs with a low voltage and low on-resistance.

Sixth Embodiment

Figure 17:
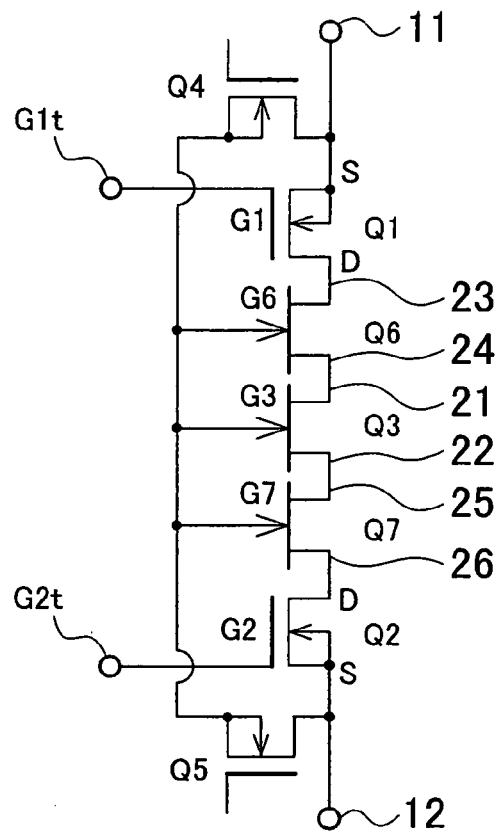
FIG. 17 is a circuit diagram of a semiconductor switch of a sixth embodiment according to the present invention.

FIG. 17 is a circuit diagram of a semiconductor switch of a sixth embodiment according to the present invention. The semiconductor switch, shown in FIG. 17, has a feature to further include, in addition to the structure shown in FIG. 17, a normally on type FET Q6 with a medium voltage connected between the FETs Q1, Q3 and a normally on type FET Q7 with a medium voltage connected between the FETs Q3, Q2. The sources S of the FETs Q4, Q5 are connected to the gate G3 of the FET Q3, the gate G6 of the FET Q6 and the gate 7 of the FTE Q7.

The semiconductor switch of the sixth embodiment with such a structure operates substantially in the same manner as that in which the semiconductor switch, shown in FIG. 13, operates. But, the semiconductor switch of the sixth embodiment differs from that shown in FIG. 13 in that the gate G3 of the FET Q3, the gate G6 of the FET Q6 and the gate 7 of the FTE Q7 are arranged to have the same potential as that of the source S of the FET connected to the terminal with a low potential whereby the FET Q3, the FET Q6 and the FTE Q7 are turned on.

Thus, the semiconductor switch of the sixth embodiment has the same advantageous effects as those of the semiconductor switch of the fifth embodiment and is able to stably turn on the FETs Q4, Q5, thereby preventing erroneous operation caused by noises and leakage current.

Seventh Embodiment

Figure 18:
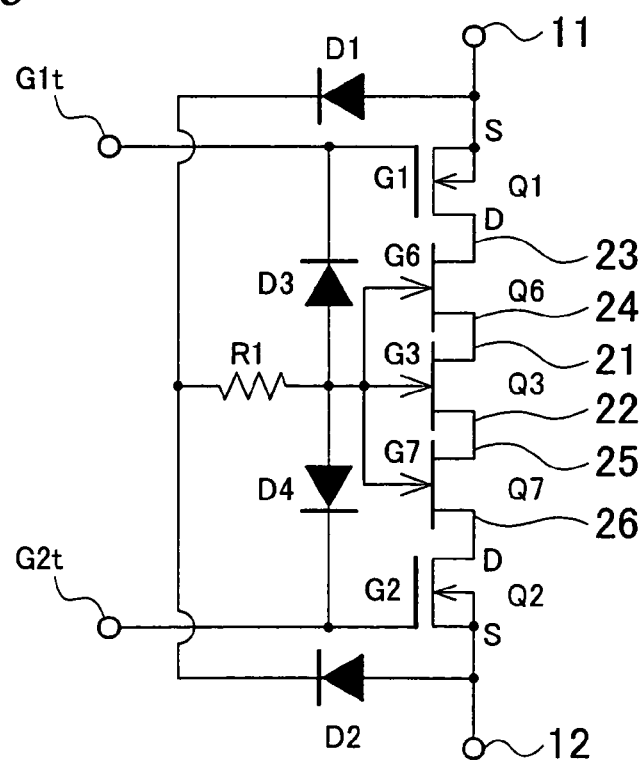
FIG. 18 is a circuit diagram of a semiconductor switch of a seventh embodiment according to the present invention.

FIG. 18 is a circuit diagram of a semiconductor switch of a seventh embodiment according to the present invention. The semiconductor switch, shown in FIG. 18, has a feature to further include, in addition to the structure shown in FIG. 14, a normally on type FET Q6 with a medium voltage connected between the FETs Q1, Q3 and a normally on type FET Q7 with a medium voltage connected between the FETs Q3, Q2. Connected to the gate G3 of the FET Q3 are the gate G6 of the FET Q6 and the gate 7 of the FTE Q7.

The semiconductor switch of the eighth embodiment with such a structure has the same advantageous effects as those of the semiconductor switch of the fifth embodiment and is able to allow current to flow from the terminal with a high potential to the gate G3 of the FET Q3, the gate G6 of the FET Q6 and the gate 7 of the FTE Q7 via the diode and the resistor to permit the gate voltage to lie at a positive voltage whereby the FET Q3, the FET Q6 and the FTE Q7 are reliably turned on.

Eighth Embodiment

Figure 19:
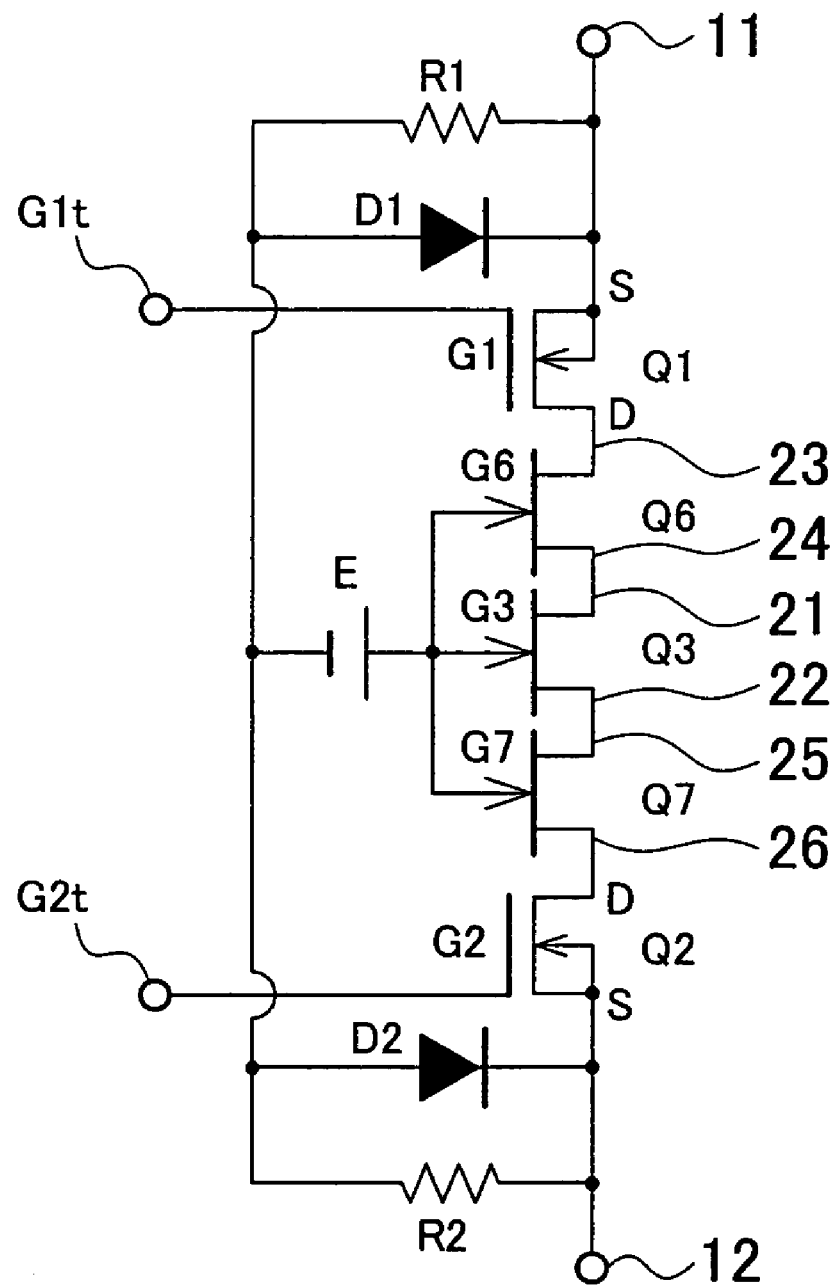
FIG. 19 is a circuit diagram of a semiconductor switch of an eighth embodiment according to the present invention.

FIG. 19 is a circuit diagram of a semiconductor switch of an eighth embodiment according to the present invention. The semiconductor switch has a feature to further include, in addition to the structure shown in FIG. 15, a normally on type FET Q6 with a medium voltage connected between the FETs Q1, Q3 and a normally on type FET Q7 with a medium voltage connected between the FETs Q3, Q2. Connected to the gate G3 of the FET Q3 are the gate G6 of the FET Q6 and the gate 7 of the FTE Q7.

The semiconductor switch of the seventh embodiment with such a structure has the same advantageous effects as those of the semiconductor switch of the fifth embodiment and since a direct-voltage of the direct current power supply E is applied to the gate G3 of the FET Q3, the gate G6 of the FET Q6 and the gate 7 of the FTE Q7 as a bias voltage at all times, no shortage in gate voltage occurs and no erroneous operations occur in the FET Q3, the FET Q6 and the FTE Q7.

Although the semiconductor switches of the first, third to fifth and seventh and eighth embodiments have employed the resistor R1 to allow current to flow, a constant current element and constant current circuit or the like may be employed, for thereby permitting a forward current to stably flow in a value ranging from a low voltage to a high voltage.

INDUSTRIAL APPLICABILITY

According to the present invention, connecting a normally on type FET between a first normally off type FET and a second normally off type FET enables the provision of a semiconductor switch with a high withstand voltage at low cost.

The invention claimed is:

1. A semiconductor switch comprising:
 a normally on type FET that passes a current between a drain and source thereof under zero state of a gate signal;
 first and second normally off type FETs, each of which does not pass a current between a drain and source thereof under zero state of a gate signal, the first and second normally off type FETs being connected to the normally on type FET therebetween in series; and
 control means operative to turn on and turn off the normally on type FET based on turning on or turning off the first and second normally off type FETs, the control means including;
  a first diode having one electrode connected to the source of the first normally off type FET;
  first current supply means for supplying a current to the first diode;
  a second diode having one electrode connected to the source of the second normally off type FET and having the other electrode connected to the other electrode of the first diode; and
  second current supply means for supplying a current to the second diode;
  wherein a junction between the other electrode of the first diode and the other electrode of the second diode is connected to a gate of the normally on type FET.

2. The semiconductor switch according to claim 1, further comprising a direct current power supply by which a direct current is applied to the gate of the normally on type FET.

3. The semiconductor switch according to claim 1, wherein the normally on type FET includes a compound semiconductor and the first and second normally off type FETs include Si-semiconductor.

4. The semiconductor switch according to claim 1, wherein the normally on type FET includes a MES FET.

5. The semiconductor switch according to claim 1, wherein the normally on type FET includes a high voltage semiconductor FET and the first and second normally off type FETs include a FET with low voltage and low on-resistance.

6. A semiconductor switch comprising:
 a plurality of normally on type FETs connected in series, each of which passes a current between a drain and source thereof under zero state of a gate signal;
 first and second normally off type FETs, each of which does not pass a current between a drain and source thereof under zero state of a gate signal, the first and second normally off type FETs being connected to the plurality of normally on type FETs therebetween in series; and
 control means operative to turn on and turn off the plurality of normally on type FETs based on turning on or turning off the first and second normally off type FETs, the control means including:
  a first diode having one electrode connected to the source of the first normally off type FET;
  first current supply means for supplying a current to the first diode;
  a second diode having one electrode connected to the source of the second normally off type FET and having the other eletrode connected to the other electrode of the first diode; and
  second current supply means for supplying a current to the second diode,
  wherein a junction between the other electrode of the first diode and the other electrode of the second diode is connected to the gates of the plurality of normally on type FETs.

7. The semiconductor switch according to claim 6, further comprising a direct current power supply by which a direct current is applied to the gates of the plurality of normally on type FETs.

8. The semiconductor switch according to claim 6, wherein the plurality of normally on type FETs include a compound semiconductor and the first and second normally off type FETs include Si-semiconductor.

9. The semiconductor switch according to claim 6, wherein the plurality of normally on type FETs includes a MES FET.

10. The semiconductor switch according to claim 6, wherein the plurality of normally on type FETs includes a high voltage semiconductor FET and the first and second normally off type FETs include a FET with low voltage and low on-resistance.

11. A semiconductor switch comprising:
 a normally on type FET that passes a current between a drain and source thereof under zero state of a gate signal;
 first and second normally off type FETs, each of which does not pass a current between a drain and source thereof under zero state of a gate signal, the first and second normally off type FETs being connected to the normally on type FET therebetween in series; and
 control means operative to turn on and turn off the normally on type FET based on turning on or turning off the first and second normally off type FETs, the control means including;
  a first diode having one electrode connected to the source of the first normally off type FET;
  a second diode having one electrode connected to the source of the second normally off type FET and having the other electrode connected to the other electrode of the first diode;
  a resistor connected between a junction between the other electrode of the first diode and the other electrode of the second diode and the gate of the normally on type FET;
  a third diode connected between the gate of the normally on type FET and the gate of the first normally off type FET; and
  a fourth diode connected between the gate of the normally on type FET and the gate of the second normally off type FET.

12. The semiconductor switch according to claim 11, wherein the normally on type FET includes a compound semiconductor and the first and second normally off type FETs include Si-semiconductor.

13. The semiconductor switch according to claim 11 wherein the normally on type FET includes a MES FET.

14. The semiconductor switch according to claim 11 wherein the normally on type FET includes a high voltage semiconductor FET and the first and second normally off type FETs include a FET with low voltage and low on-resistance.

15. A semiconductor switch comprising:
 a plurality of normally on type FETs connected in series, each of which passes a current between a drain and source thereof under zero state of a gate signal;

first and second normally off type FETs, each of which does not passes a current between a drain and source thereof under zero state of a gate signal, the first and second normally off type FETs being connected to the plurality of normally on type FETs therebetween in series; and control means operative to turn on and turn off the plurality of normally on type FETs based on turning on or turning off the first and second normally off type FETs, the control means including;

a first diode having one electrode connected to the source of the first normally off type FET;

a second diode having one electrode connected to the source of the second normally off type FET and having the other electrode connected to the other electrode of the first diode;

a resistor connected between a junction between the other electrode of the first diode and the other electrode of the second diode and the gates of the plurality of normally on type FETs;

a third diode connected between the gates of the plurality of normally on type FETs and the gate of the first normally off type FET; and a fourth diode connected between the gates of the plurality of normally on type FETs and the gate of the second nonnally off type FET.

16. The semiconductor switch according to claim 15, wherein the plurality of normally on type FETs includes a compound semiconductor and the first and second normally off type FETs include Si-semiconductor.

17. The semiconductor switch according to claim 15, wherein the plurality of normally on type FETs includes a MES FET.

18. The semiconductor switch according to claim 15, wherein the plurality of normally on type FETs includes a high voltage semiconductor FET and the first and second normally off type FETs include a FET with low voltage and low on-resistance.

19. A semiconductor switch comprising:
a normally on type FET that passes a current between a drain and source thereof under zero state of a gate signal;

first and second normally off type FETs, each of which does not passes a current between a drain and source thereof under zero state of a gate signal, the first and second normally off type FETs being connected to the normally on type FET therebetween in series; and control means operative to turn on and turn off the normally on type FET based on turning on or turning off the first and second normally off type FETs, the control means including:

a first switch having a first electrode connected to the source of the first normally off type FET; and a second switch having a third electrode connected to the source of the second normally off type FET and a fourth electrode connected to a second electrode of the first switch;

wherein a junction between the second electrode of the first switch and the fourth electrode of the second switch is connected to the gate of the normally on type FET;

whereby one of the first and second switches, which is connected to one of the first and second normally off type FETs of which source potential is low, is turned on whereas the other one of the first and second switches, which is connected to the other one of the first and second normally off type FETs of which source potential is high, is turned off.

20. The semiconductor switch according to claim 19, wherein the normally on type FET includes a compound semiconductor and the first and second normally off type FETs include Si-semiconductor.

21. The semiconductor switch according to claim 19, wherein the normally on type FET includes a MES FET.

22. The semiconductor switch according to claim 19, wherein the normally on type FET includes a high voltage semiconductor FET and the first and second normally off type FETs include a FET with low voltage and low on-resistance.

23. A semiconductor switch comprising:
a plurality of normally on type FETs connected in series, each of which passes a current between a drain and source thereof under zero state of a gate signal;

first and second normally off type FETs, each of which does not passes a current between a drain and source thereof under zero state of a gate signal, the first and second normally off type FETs being connected to the plurality of normally on type FETs therebetween in series; and control means operative to turn on and turn off the plurality of normally on type FETs based on turning on or turning off the first and second normally off type FETs, the control means including:

a first switch having a first electrode connected to the source of the first normally off type FET; and a second switch having a third electrode connected to the source of the second normally off type FET and a fourth electrode connected to a second electrode of the first switch;

wherein a junction between the second electrode of the first switch and the fourth electrode of the second switch is connected to the gates of the plurality of normally on type FETs;

whereby one of the first and second switches, which is connected to one of the first and second normally off type FETs of which source potential is low, is turned on whereas the other one of the first and second switches, which is connected to the other one of the first and second normally off type FETs of which source potential is high, is turned off.

24. The semiconductor switch according to claim 23, wherein the plurality of normally on type FETs includes a compound semiconductor and the first and second normally off type FETs include Si-semiconductor.

25. The semiconductor switch according to claim 23, wherein the plurality of normally on type FETs includes a MES FET.

26. The semiconductor switch according to claim 23, wherein the plurality of normally on type FETs includes a high voltage semiconductor FET and the first and second normally off type FETs include a FET with low voltage and low on-resistance.

* * * * *